United States Patent
Yokonaga

(10) Patent No.: US 8,158,534 B2
(45) Date of Patent: Apr. 17, 2012

(54) REDUCTION OF DEFECTS FORMED ON THE SURFACE OF A SILICON OXYNITRIDE FILM

(75) Inventor: Noriyuki Yokonaga, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/032,191

(22) Filed: Feb. 22, 2011

(65) Prior Publication Data

US 2011/0143554 A1     Jun. 16, 2011

Related U.S. Application Data

(62) Division of application No. 12/004,676, filed on Dec. 20, 2007, now Pat. No. 7,892,984.

(30) Foreign Application Priority Data

Dec. 28, 2006  (JP) .................................. 2006-355027

(51) Int. Cl.
    *H01L 21/469*     (2006.01)

(52) U.S. Cl. ................................ 438/769; 257/E21.285
(58) Field of Classification Search ................. 438/769; 257/E21.285
    See application file for complete search history.

(56) References Cited

U.S. PATENT DOCUMENTS

| | | | |
|---|---|---|---|
| 8,017,455 B2 * | 9/2011 | Muranaka | 438/149 |
| 2005/0186803 A1 | 8/2005 | Umezawa | |
| 2006/0057793 A1 * | 3/2006 | Hatori et al. | 438/197 |
| 2006/0180879 A1 * | 8/2006 | Maes et al. | 257/411 |
| 2007/0029626 A1 * | 2/2007 | Sakama et al. | 257/411 |
| 2008/0090378 A1 | 4/2008 | Tsunoda | |
| 2008/0090425 A9 * | 4/2008 | Olsen | 438/786 |
| 2008/0119057 A1 * | 5/2008 | Chua et al. | 438/763 |

* cited by examiner

*Primary Examiner* — Thao Le

(57) ABSTRACT

Methods for reducing defects on the surface of a silicon oxynitride film are disclosed, in one embodiment, the methods include, forming a silicon oxynitride film on a semiconductor substrate and heating the silicon oxynitride film to increase a hydrophilicity of a surface of the silicon oxynitride film prior to treating the surface of the silicon oxynitride film with a hydrofluoric acid.

7 Claims, 9 Drawing Sheets

FIG. 2A
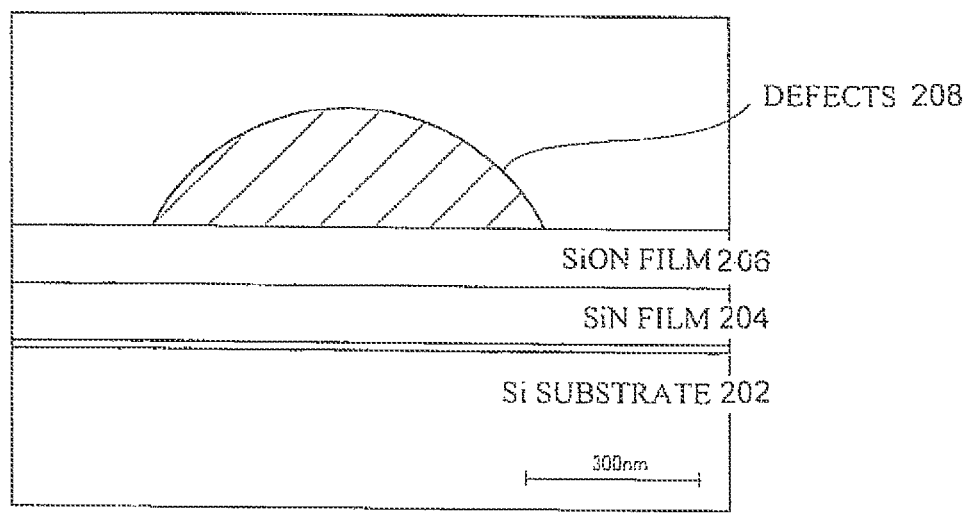
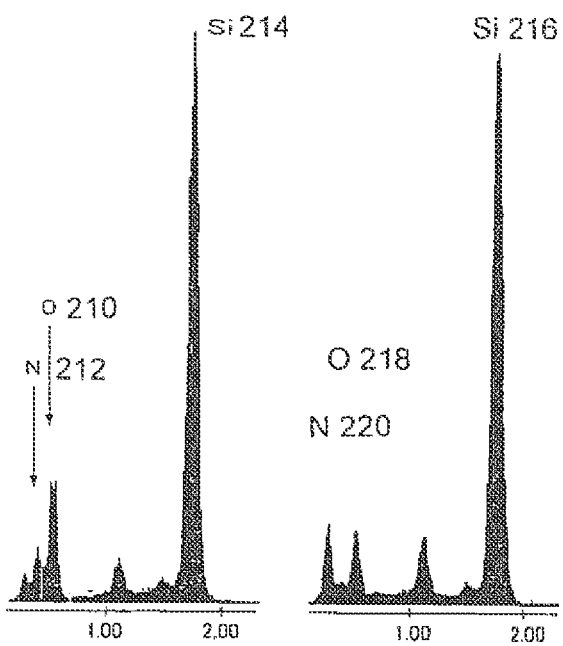
FIG. 2B   FIG. 2C derstanding of the present invention. However, it will be
REDUCTION OF DEFECTS FORMED ON THE SURFACE OF A SILICON OXYNITRIDE FILM

CROSS-REFERENCE TO RELATED APPLICATIONS

This application is a divisional of U.S. patent application Ser. No. 12/004,676, filed on Dec. 20, 2007, entitled "Reduction of Defects Formed on the Surface of a Silicon Oxynitride Film," which claims priority from Japanese patent application 2006-355027 filed Dec. 28, 2006 and which is hereby incorporated herein by reference in its entirety.

FIELD OF TECHNOLOGY

This invention relates generally to methods for reducing defects on the surface of a silicon oxynitride

BACKGROUND

When semiconductor devices are manufactured, a silicon oxynitride film may be formed on a semiconductor substrate to use it as a reflection preventing film. The silicon oxynitride film may he formed by plasma chemical vapor deposition (CVD) or low pressure chemical vapor deposition (LP-CVD). In addition, a hydrofluoric acid treatment is used to remove etching residues or to remove a natural oxide film on a wafer by immersing the wafer in a hydrofluoric acid solution made of hydrofluoric acid (HF) and water ($H_2O$).

Japanese Patent Application Publication No. 59-90942 discloses a technique of leaving a protection oxide film without etching until LOCOS oxide film is grown on a silicon substrate, and washing the surface of the silicon substrate that is covered with a hydrophilic silicon nitride film and the protection oxide film. The technique restrains the generation of washing residues.

However, in a case where the surface of the silicon oxynitride film is subjected to the hydrofluoric acid treatment after the formation of the silicon oxynitride film, defects may be formed on the surface of the silicon oxynitride film.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a method for manufacturing a semiconductor device by forming a silicon oxynitride film on a semiconductor substrate and heating the silicon oxynitride film to increase a hvdmophiiicity of a surface of the silicon oxynitride film prior to treating the surface of the silicon oxynitride film with a hydrofluoric acid, As illustrated in the detailed description, other embodiments pertain to methods and structures that provide an improved fabrication process of an integrated circuit memory device, and in particular, a reduction of defects on the surface of silicon oxynitride film in the integrated circuit memory device. By heating the film before subjecting it to a hydrofluoric acid, the embodiments provide the device with fewer defects on the film surface.

BRIEF DESCRIPTION OF THE DRAWINGS

Example embodiments are illustrated by way of example and not limitation in the figures of the accompanying drawings, in which like references indicate similar elements and in which:

FIG. 2A is an exploded view of a transmission electron microscope (TEM) image showing a cross-section of a defect formed on a silicon oxynitride film.

FIGS. 2B and 2C show the EDX spectrum of a silicon oxynitride film and a defect, respectively.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit arid scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details, in other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art, A procedure, logic block, process, etc., is herein, and generally, conceived to be a self-consistent sequence of steps or instructions leading to a desired result, The steps are those requiring physical manipulations of physic quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Figure 1:
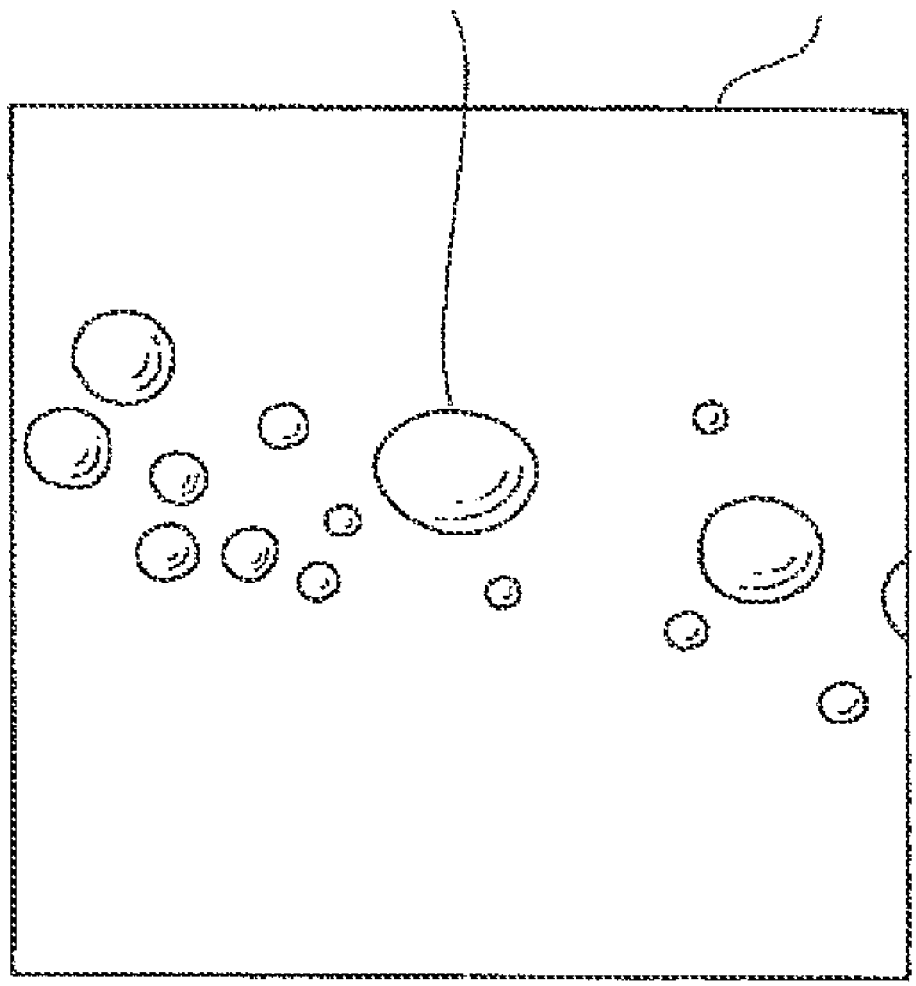
FIG. 1 is a schematic view of a scanning electron microscope (SEM) image showing defects formed on a silicon oxynitride film.

Briefly stated, embodiments reduce the defects formed on the surface of the silicon oxynitride film of integrated circuit memory device. By increasing the hydrophilicity of the film through heating the surface, the embodiments reduce the number of defects generated on the film surface, FIG. 1 is a schematic view of a SEM (Scanning Electron Microscope) image of the surface of a silicon oxynitride (SiON) film 102. FIG. 1 illustrates defects 104 formed on the surface of the silicon oxynitride film 102 treated. by a hydrofluoric acid. More specifically, a silicon nitride (SIN) film was formed on a silicon substrate by low pressure chemical vapor deposition (LP-CVD), and the SiON film 102 was formed on the silicon nitride film by plasma CVD. After immersed in a hydrofluoric acid solution, the surface of the silicon oxynitride (SiON) film 102 was rinsed with water. The defects 104 in the form of a. protruding globe were formed on the surface of the SiON film 102.

FIG. 2A is an exploded view of a TEM image showing a cross-section of a defect formed on a silicon oxynitride film. In FIG. 2A, a section of the defect was cut with a FIB (Focused ion Beam) and is observed through a TEM (Transmission Electron Microscope). A silicon nitride (SiN) film 204 is formed on a silicon substrate 202 by LP-CVD, and a silicon oxynitride film 206 is formed on the silicon nitride film 204 by plasma CVD. A defect 208 is formed on the silicon oxynitride film 206.

FIGS. 2B and 2C show the spectrums obtained by analyzing the silicon oxynitride film 206 and the defect 208 by EDX (Energy Dispersive X-ray spectroscopy). As illustrated in FIG. 2B, in the silicon oxynitride film 206, signals of oxygen (O) 210 and nitrogen (N) 212 as well as signals of silicon (Si) 214 are observed. As illustrated in FIG. 2C, in the defect 208, most signals are also based on the silicon 216, whereas few signals are based on the oxygen 218 and nitrogen 220. Other signals include signals based on titanium from the holder for grabbing the samples used in the EDX analysis as well as signals for gallium and carbon of the focused ion beam (FIB).

Next, the silicon substrate (e.g., a wafer) having the silicon oxynitride film formed thereon by plasma CVD is immersed in a hydrofluoric acid solution with a HF to $H_2O$ volume ratio of 1:50. The wafer is then rinsed with water and dried. The number of detects in the wafer with respect to the hydrofluoric acid treatment time is examined.

Figure 3:
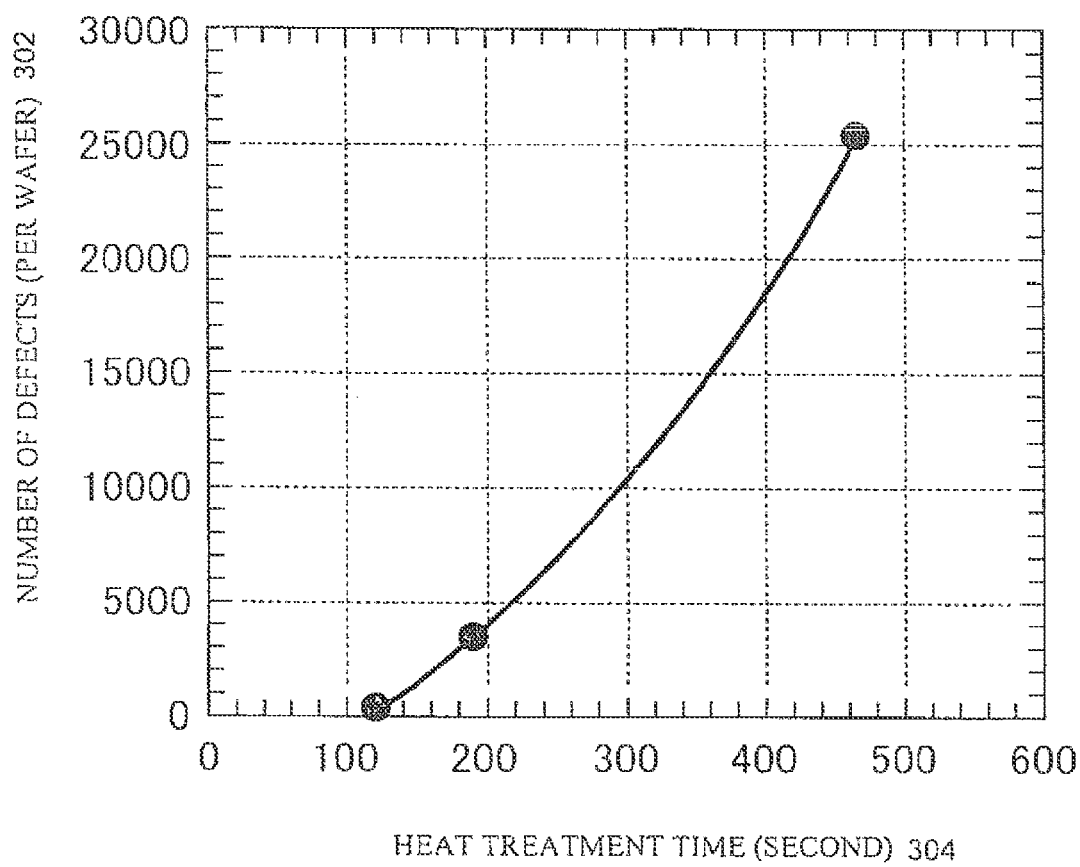
FIG. 3 shows the number of defects formed on a silicon oxynitride film with respect to hydrofluoric acid (HF) treatment time.

FIG. 3 shows the number of defects formed on the wafer 302 with respect to hydrofluoric acid treatment (HF treatment) 304. As can be seen from FIG. 3, as the hydrofluoric acid treatment lasts longer, the number of defects in the wafer rapidly increases. In addition, the hydrophilicity of the silicon substrate and the hydrophilicity of each insulating film on the silicon substrate were examined to determine the cause of the defects. To examine the hydrophilicity, the drop method was used.

Figure 4A:
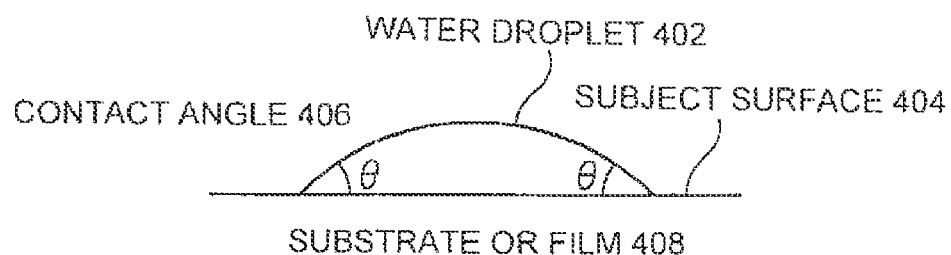
FIGS. 4A and 4B illustrate the contact angle of water and the contact angles of films before and/or after the HF treatment, respectively.
Figure 4B:
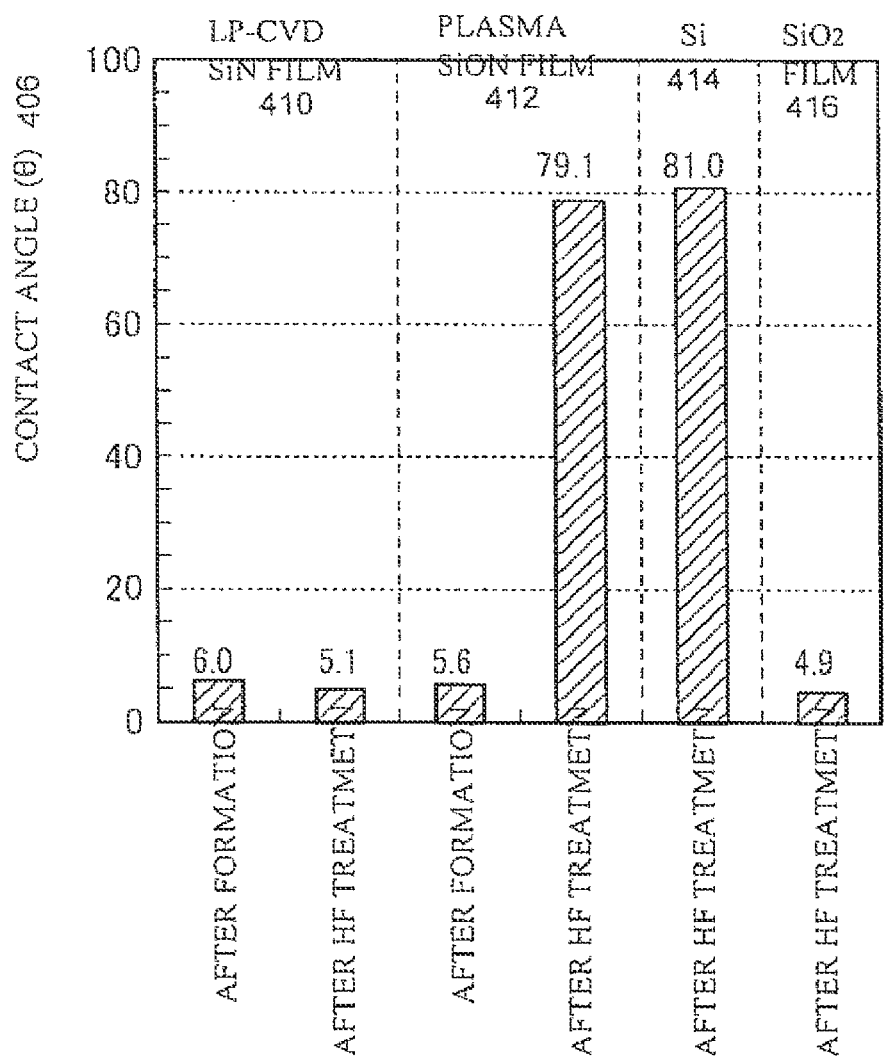

FIGS. 4A and 4B illustrate the contact angle of water and the contact angles of films before and/or after the HF treatment, respectively. As shown in FIG. 4A, according to the drop method, a water droplet 402 is dropped on a subject surface 404, and the hydrophilicity of the subject is evaluated based on the contact angle 406 of the water droplet 402 with respect to the subject surface 404 of a substrate or a film 408.

Where the contact angle (θ) 406 is large, the subject surface 404 is hydrophobic. Where the contact angle (θ) 406 is small, the subject surface 404 is hydrophilic.

Figure 5A:
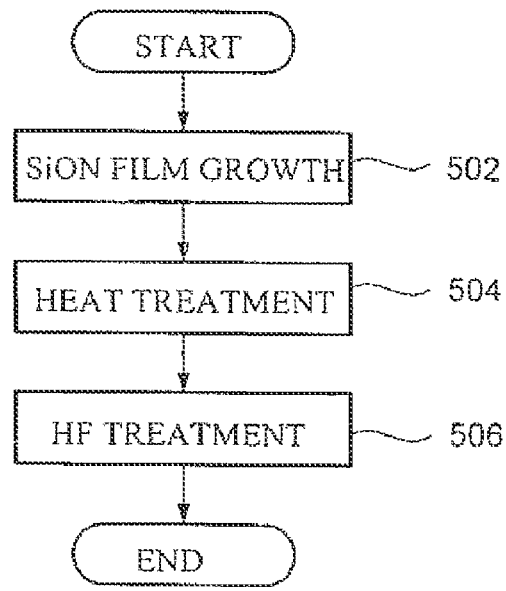
FIG. 5A is a flowchart of an operation in accordance with one embodiment of the present invention.

FIG. 4B shows the hydrophilicity of each insulating film surface examined by the drop method. The contact angle 406 of a silicon nitride film 410 formed by LP-CVD is 6.0° immediately after the film formation, and is 5.1° after the HF treatment. The contact angle 406 of a silicon oxynitride film 412 formed by plasma CVD is 5.6° immediately after the film formation, is 79.1° after the HF treatment. The contact angle 406 of a Silicon substrate 414. and the contact angle 406 of a silicon oxide film 416 after the HF treatment are 81.0° and 4.9°, respectively. Accordingly, the silicon nitride film 410 and the silicon oxide film 416 maintain hydrophilic surfaces even after the HF treatment. On the other hand, the surface of the silicon oxynitride. film 412 becomes hydrophobic after the FIF treatment. It appears that the defects are caused as the surface of the silicon oxynitride film 412 becomes hydrophobic, First Embodiment The following is the description of an embodiment for reducing defects produced when the silicon oxynitride film is subjected to the hydrofluoric acid treat e FIG. 5A is a flowchart of an operation in accordance with one embodiment of the present invention. In operation 502, a silicon oxynitride film is formed on a silicon substrate. In operation 504, the silicon oxynitride film is treated with a heat in an oxygen rich atmosphere. in operation 506, the silicon oxynitride film is treated with a hydrofluoric acid, where water to the hydrofluoric acid volume ratio is 50:1.

Figure 5B:
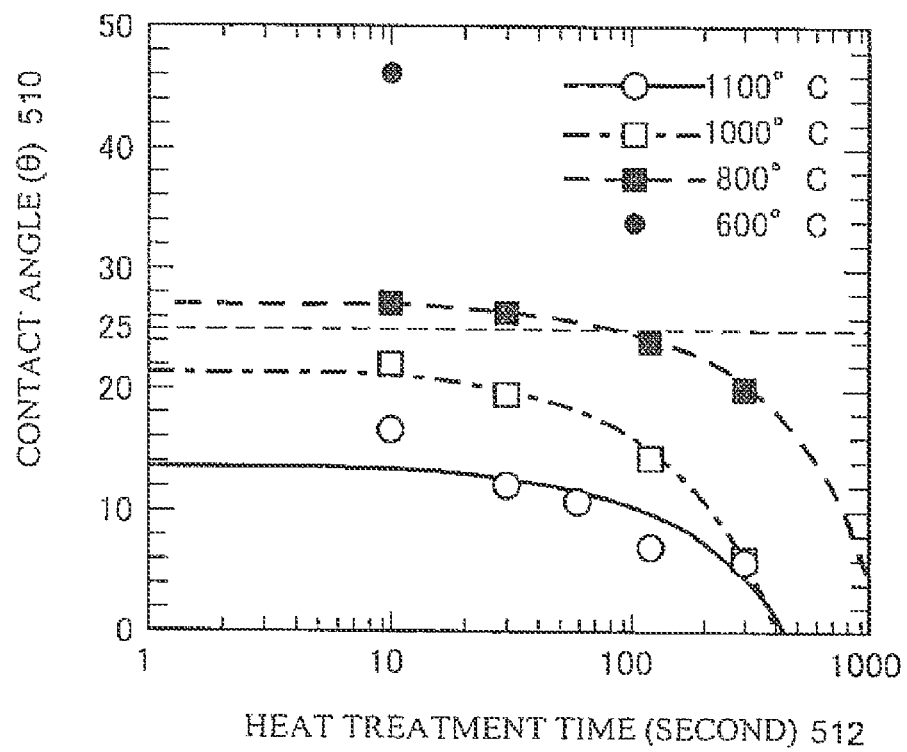
FIG. 5B shows the contact angle of the surface of the silicon oxynitride film with respect to the time taken for the heat treatment in FIG. 5A.

FIG. 5B shows the contact angle 510 of a silicon oxynitride film with respect to time 512 taken for the heat treatment. in FIG. 5A. The contact angle 510 of the surface of the silicon oxynitride film foamed in this manner is measured. FIG. 5B shows the result of the measurement of the contact angle 510 with respect to the heat treatment time 512, while varying the temperature used for the heat treatment. As the temperature increases, the contact angle 510 decreases, and the surface of the silicon oxynitride film becomes more hydrophilic, As the heat treatment time 512 increases, the contact angle 510 decreases, and the surface of the silicon oxynitride film becomes more hydrophilic. Additionally, given enough time (e.g., 1000 seconds), the contract angle 510 reaches zero irrespective of the temperature used in the heat treatment. It is considered that, when the surface of the silicon oxynitride film becomes hydrophobic, or when the contact angle becomes smaller, the number of defects on the surface of the silicon oxynitride film decreases.

Figure 6:
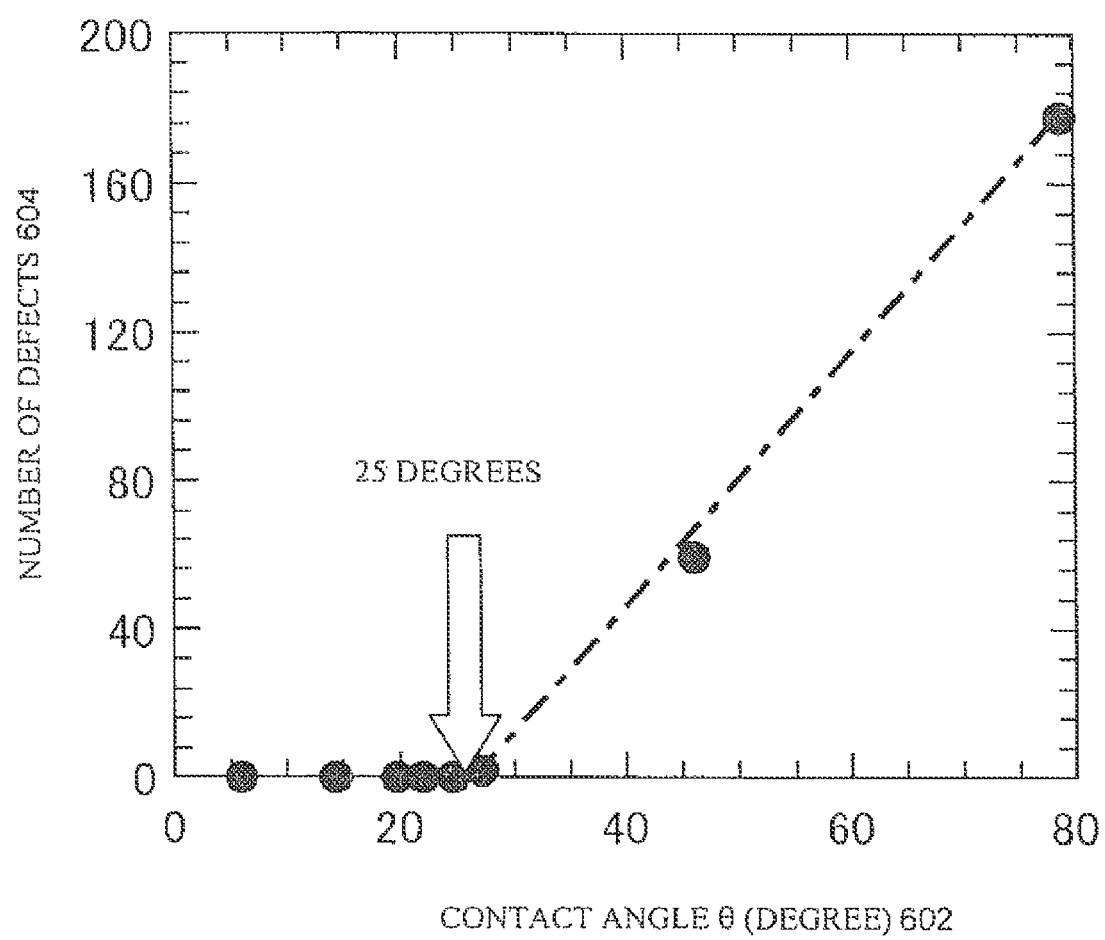
FIG. 6 shows the number of defects with respect to the contact angle of the surface of a silicon oxynitride film.

FIG. 6 shows the number of defects 604 with respect to the contact angle 602 of the surface of a silicon oxynitride film. The number of defects 604 in the wafer produced by the method shown in FIG. 5A is counted. As shown in FIG. 6, few defects are produced when the contact angle 602 is 25° or smaller. Where the contact angle 602 is larger than 25°, the number of defects 604 produced is proportional to the size of the contact angle 602. Thus, the process for increasing the hydrophilicity of the silicon oxynitride film is performed prior to treating the silicon oxynitride film with the hydrofluoric acid rather than later. By doing so, the generation of defects on the surface of the silicon oxynitride film due to the hydrofluoric acid treatment can be restrained. As illustrated in FIG. 6, this process can effectively reduce the number of defects 604 since it reduces the angle of the water with respect to the surface of the silicon oxynitride film. If the contact angle 602 is 50° or smaller, the number of defects 604 can be decreased by at least one half Furthermore, if the contact angle 602 is 25° or smaller, the number of defects 604 becomes negligible.

As can be seen from FIG. 5, the heat treatment as in operation 504 of FIG. 5A may be carried out to reduce the contact angle. By carrying out the heat treatment at 800 ° C. or higher, the contact angle can be made 25 ° or smaller. In this manner, few defects are formed on the silicon oxynitride film. Alternatively, the 800 ° C. heat treatment is carried out for 100 seconds or longer, so that the contact angle can be made 25° or smaller. In operation 504, the heat treatment is carried out in an oxygen rich atmosphere. In an alternative embodiment, the same effects may be achieved by carrying out the heat treatment in a nitrogen rich atmosphere, where the nitrogen is in the state of inert gas.

it is appreciated that any treatment in addition to the heat treatment may be carried out to make the surface of the silicon oxynitride film hydrophilic. Also, the silicon oxynitride film may be also formed by LP-CVD as well as by plasma CVD. It is also appreciated that the $H_2O$ to HF ratio in the hydrofluoric acid solution is not limited to just 50:1.

Second Embodiment

Figure 7A:
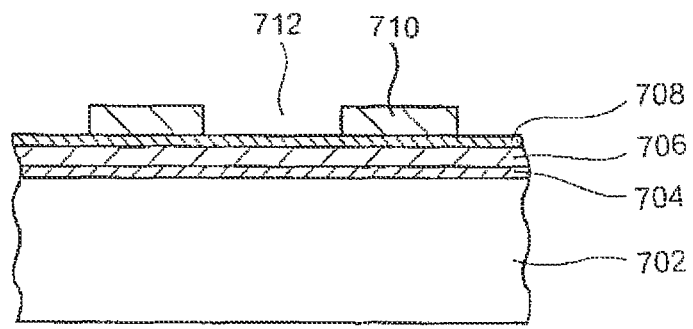
FIG. 7A through 7D are cross-sectional views illustrating a method for forming shallow trench isolation (ST1) in accordance with one embodiment of the present invention.
Figure 7B:
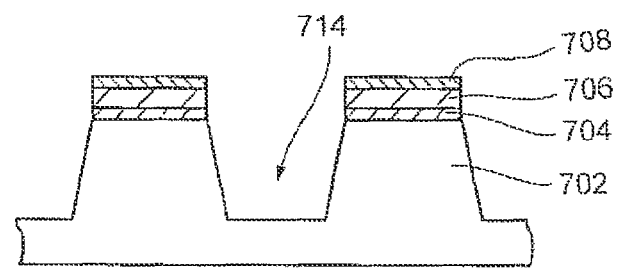

A second embodiment of the present invention is an example case where the first embodiment is applied to the formation of shallow trench isolation (STD. FIG. 7A through 7D are cross-sectional views illustrating a method for forming shallow trench isolation (STI) in accordance with one embodiment of the present invention. As illustrated in FIG. 7A, a barrier silicon oxide film 704 is formed on a silicon semiconductor substrate 702 by thermal oxidation. A silicon nitride film 706 is formed by LP-CVD, and a silicon oxynitride film 708 (e,g., 35 nm thick) is formed by plasma Cva A photoresist 710 is applied onto the silicon oxynitride film 708, and openings 712 are formed by an exposure technique. Here, the oxynitride film 708 functions as a reflection preventing film. As illustrated in FIG. 7B, with the photoresist 710 serving as a mask, etching is perfbrined on the portions of the silicon oxynitride film 708, the silicon nitride film 706 and the silicon oxide film 704, which exist below the openings 712. Etching is then performed on the semiconductor substrate 702 to form trenches 714 in the semiconductor substrate 702.

Figure 7C:
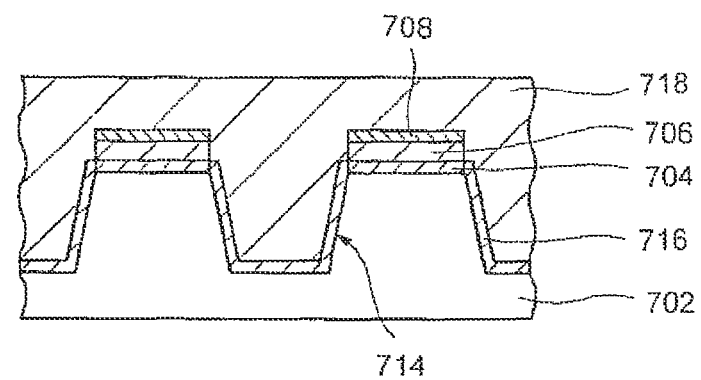
Figure 7D:
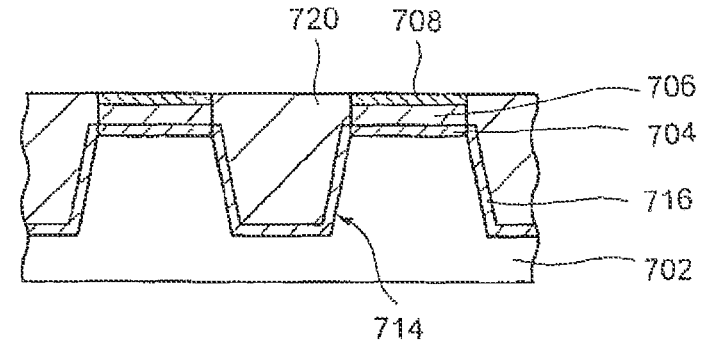

As illustrated in FIG. 7C, a heat treatment is carried out at 800 ° C. or higher. Then, the surface of the portion of the semiconductor substrate 702 in each of the trenches 714 is subjected to a hydrofluoric acid treatment. A silicon oxide film 716 is then formed on the surface of the portion of the semiconductor substrate 702 in each of the trenches 714 by thermal oxidation. A silicon oxide layer 718 is then formed in each of the trenches 714 and on the silicon oxynitride film 708 by dense plasma CVD. As illustrated in FIG. 7D, polishing is performed on the silicon oxide layer 718 by CNIP, until the polishing reaches the silicon oxynitride film 708. In the polishing, a ceria shiny containing cerium oxide as an abrasive coating is used. The silicon oxynitride film 708 is used as a stopper layer for the polishing of the silicon oxide film 718. Then, a silicon oxide layer 720 is formed at the completion of the polishing.

In accordance with the embodiment, as shown in FIG. 7A, there is a procedure for forming the photoresist 710 having the openings 712 on the silicon oxynitride film 708. The silicon oxynitride film 708 serves as the reflection preventing film for preventing reflection when the photoresist 710 having the openings 712 is formed. In this manner, the process (e.g., of FIG. 5A) described in the first embodiment can be applied to the silicon oxynitride film to be used as the reflection preventing film.

Also, as shown in FIG. 7C, the silicon oxide layer 718 is formed on the silicon oxynitride film 708. As shown in FIG. 7D, polishing is performed on the silicon oxide layer 718 until the polishing reaches the silicon oxynitride film 708. In this manner, the embodiment can be applied to the silicon oxynitride film to be used as the stopper in the polishing.

Figure 8:
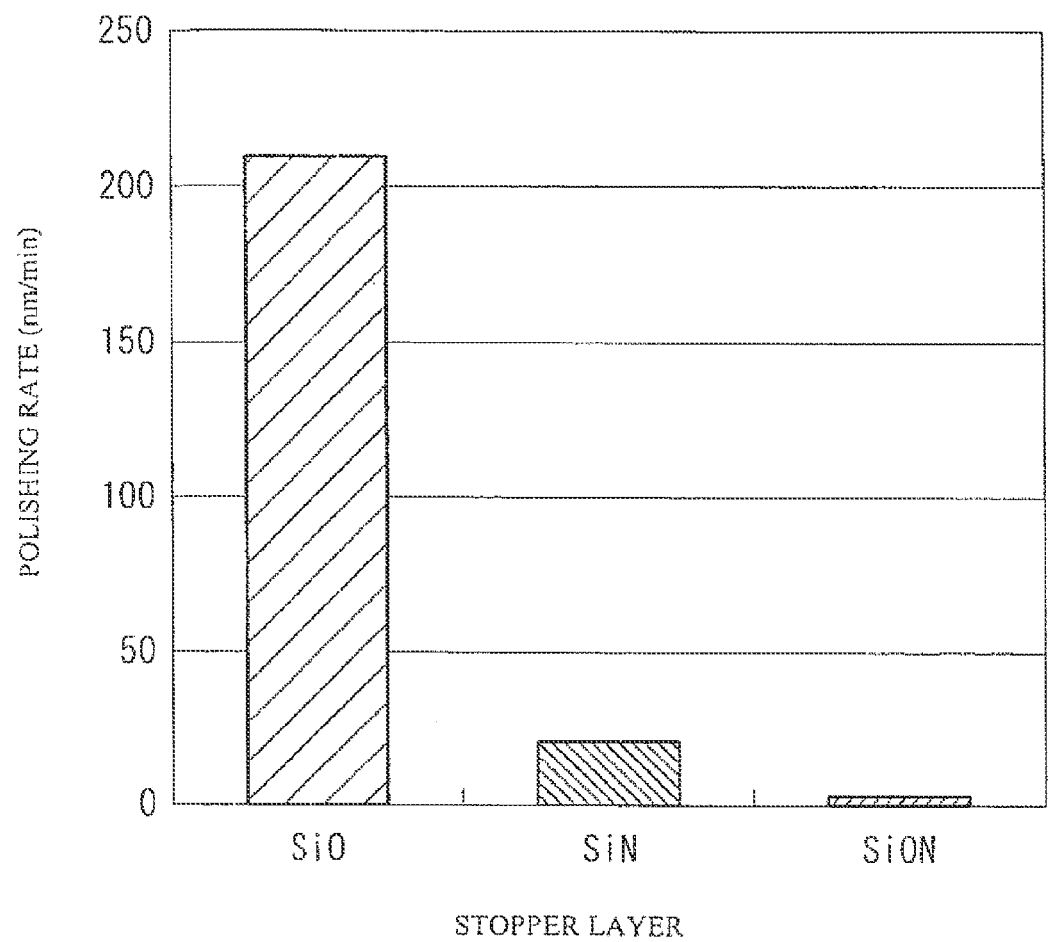
FIG. 8 illustrates the polishing rates of a silicon oxide, a silicon nitride and a oxynitride.

In FIG. 7D, a ceria slurry can be used as the polishing agent for polishing the silicon oxide layer 718. FIG. 8 illustrates the polishing rates of a silicon oxide film (SiO), a silicon nitride film (SiN) and a silicon oxynitride film (SiON). In a case where polishing is performed with the use of a ceria slurry, the silicon oxynitride film can function as an excellent stopper layer.

Furthermore, as shown in FIG. 7B, the openings 712 are formed in the silicon oxynitride film 708, and the trenches 714 are formed at the portions of the semiconductor substrate 702 located below the openings. The surface of the portion of the semiconductor substrate 702 in each of the trenches 714 is subjected to a hydrofluoric acid treatment. Accordingly, when the hydrofluoric acid treatment is carried out while the silicon oxynitride film 708 serving as the reflection preventing film or the polishing stopper layer is exposed at the time of the STI formation, the number of defects formed on the silicon oxynitride film 708 can be reduced in accordance with the present invention.

Further, as shown in FIG. 7C, the silicon oxide layer 718 is formed in each of the trenches 714 and on the silicon oxynitride film 708. Polishing is then performed on the silicon oxide layer 718, until the polishing reaches the silicon oxynitride film 708, in this manner, the silicon oxynitride film 708 can be used as the polishing stopper layer at the time of the STI formation.

Third Embodiment

A third embodiment of the present invention is an example case where the first embodiment is applied to the formation of contact holes in an interlayer insulating film.

Figure 9A:
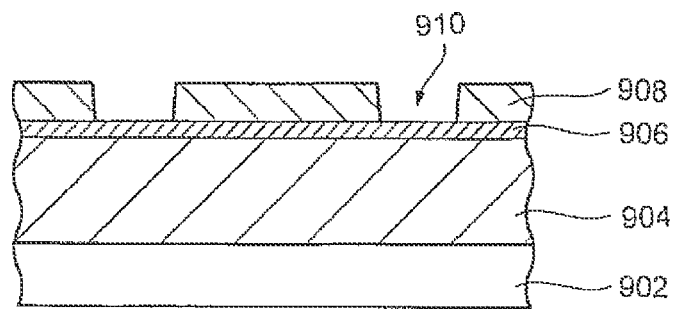
FIGS. 9A through 9D are cross-sectional views illustrating a method for forming contact holes in an interlayer insulating film in accordance with one embodiment of the present invention.
Figure 9B:
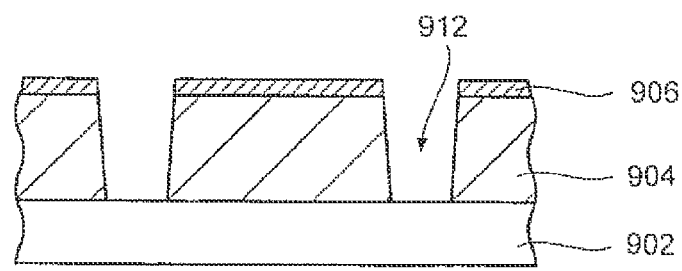

FIGS. 9A through 91) are cross-sectional views illustrating a method for forming contact holes in an interlayer insulating film in accordance with one embodiment of the present invention. As illustrated in FIG. 9A, a silicon oxide film such as a BPSG (borophosphosilicate glass) film is formed as an interlayer insulating film 904 on a semiconductor substrate 902 or on a lower wiring layer. A silicon oxynitride film 906 (e.g., 10 nm to 50 nm thick) is formed on the interlayer insulating film 904 by plasma CVD. A photoresist 908 is then applied onto the silicon oxynitride film 906, and openings 910 are formed by an exposure technique. Here, the silicon oxynitride film 906 functions as a reflection preventing film. As shown in FIG. 9B, with the photoresist 908 serving as a mask, etching is performed on the portions of the silicon oxynitride film 906 and the interlayer insulating film 904 located below the openings 910 to form contact holes 912 in the interlayer insulating film 904.

As shown in FIG. 912, heat treatment is carried out at 800 ° C. or higher. Then, the surface of the portion of the interlayer insulating film 904 in each of the contact holes 912 is subjected to a hydrofluoric acid treatment. A metal layer 914 is then formed in each of the contact hole 912 and on the silicon oxynitride film 906 by CVD. As shown in FIG. 9D, polishing is performed on the metal layer 914 by CMP until the polishing reaches the silicon oxynitride film 906. in the polishing, a ceria slurry containing cerium oxide as an abrasive coating is used. The silicon oxynitride film 906 is used as the stopper layer in the polishing of the metal layer 914. In the manner described above, the metal layer 914 is formed on the contact holes 912.

The silicon oxynitride film 906 used as the reflection preventing film or the polishing stopper layer goes through the process (e.g., of FIG. 5A) described in the first embodiment so that the number of defects on the silicon oxynitride film 906 can be reduced. Also, the silicon oxynitride film 906 is used as the polishing stopper layer, and a ceria slurry is used in the polishing of the metal layer 914, so that the polishing of the metal layer 914 can be stopped at the level of the silicon oxynitride film 906.

Furthermore, as shown in FIG. 9A, the interlayer insulating film 904 is formed on the semiconductor substrate. 902. As shown in FIG. 9B, openings 910 are formed in the silicon oxynitride film 906, and the contact holes 912 are formed at the portions of the interlayer insulating film 904 located below the openings 910. A hydrofluoric acid treatment is then carried out in the contact holes 917. Accordingly, when hydrofluoric acid treatment is carried out while the silicon oxynitride film 906 serving as the reflection preventing film or the polishing stopper layer is exposed at the time of the formation of the contact holes, the number of defects formed on the silicon oxynitride film 906 can be reduced in accordance with the present invention.

Figure 9C:
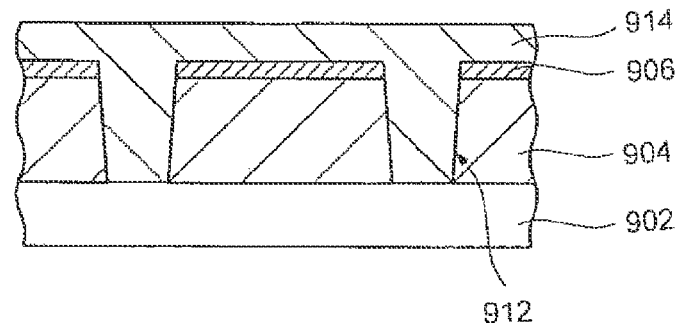
Figure 9D:
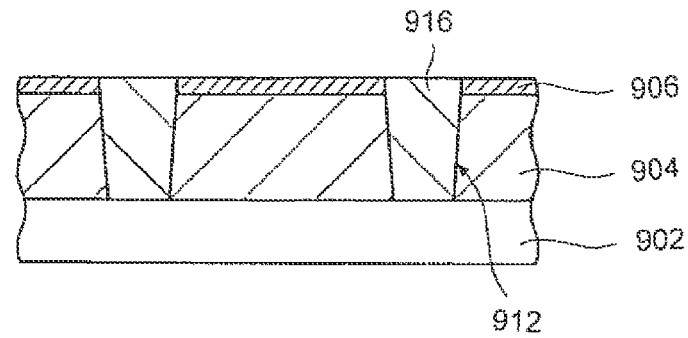

Moreover, as shown in FIG. 9C, a metal layer 914 (e.g., a top layer) is formed in each of the contact holes 912 and on the silicon oxynitride film 906. As shown in FIG. 9D, polishing is performed on the metal layer 914 until the polishing reaches the silicon oxynitride film 906, In this manner, the silicon oxynitride film 906 can be used as the stopper layer in the polishing of the metal layer 914 at the time of the formation of the metal plugs 916.

The heat treatment in the second embodiment and the embodiment should be carried out between the formation of the silicon oxynitride film and the hydrofluoric acid treatment. For example, in the second embodiment, the heat treatment may he carried out after the removal of the photoresist 710 and before the formation of the trenches 714 in the step illustrated in FIG. 7B. The film thickness of each of the silicon oxynitride films may be determined, so that each of the silicon oxynitride films can function as the reflection preventing film or the polishing stopper.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to he accorded the widest scope consistent with the principles and novel features disclosed herein.

What is claimed is:

1. A method for reducing defects on a semiconductor device, comprising:
   forming a silicon oxynitride film on a semiconductor substrate; and
   heating the silicon oxynitride film to increase a hydrophilicity of a surface of the silicon oxynitride film prior to treating the surface of the silicon oxynitride film with a hydrofluoric acid wherein a contact angle of water with respect to the surface of the silicon oxynitride film becomes less than 25 degrees after the treating the surface of the silicon oxynitride film.

2. The method of claim 1, wherein the heating the silicon oxynitride film is performed with more than 800 degrees Celsius of heat.

3. The method of claim 1, wherein the heating the silicon oxynitride film is performed at 800 degrees Celsius for approximately 100 seconds.

4. The method of claim 1, wherein the heating the silicon oxynitride film is performed for more than 1000 seconds.

5. The method of claim 1, wherein the heating the silicon oxynitride film is performed in an oxygen rich atmosphere.

6. The method of claim 1, wherein the heating the silicon oxynitride film is performed in a nitrogen rich atmosphere.

7. The method of claim 1, wherein a water to the hydrofluoric acid ratio is 50 to 1.

* * * * *